United States Patent [19]

Ushida

[11] Patent Number: 4,611,882
[45] Date of Patent: Sep. 16, 1986

[54] HIGH-FREQUENCY CIRCUIT DEVICE WITH AN ANNULAR CAPACITOR ON THE BACK OF AN INSULATED SUBSTRATE

[75] Inventor: Susumu Ushida, Soma, Japan

[73] Assignee: Alps Electric Co., Ltd., Japan

[21] Appl. No.: 530,237

[22] Filed: Sep. 8, 1983

[30] Foreign Application Priority Data

Sep. 8, 1982 [JP] Japan .............................. 57-136313[U]

[51] Int. Cl.[4] ...................... H01L 39/02; H01G 1/005
[52] U.S. Cl. ........................................ 357/80; 357/74; 361/303; 361/304; 361/306
[58] Field of Search .............................. 357/74, 75, 80; 361/303, 304, 306, 400, 402, 404, 406, 409

[56] References Cited

U.S. PATENT DOCUMENTS

| 3,900,773 | 8/1975 | Bowkley et al. | 361/303 |
| 3,936,866 | 2/1976 | Grossman et al. | 357/80 |
| 4,143,508 | 3/1979 | Ohno | 357/80 |
| 4,445,274 | 5/1984 | Suzuki et al. | 357/80 |

Primary Examiner—William L. Sikes
Assistant Examiner—Frank González
Attorney, Agent, or Firm—Guy W. Shoup

[57] ABSTRACT

A high-frequency circuit device composed of hybrid ICs, comprises an insulated substrate, an active component fabricated on the insulated substrate and including a ground terminal for grounding high-frequency signal components, a first electrode fabricated on one surface of the insulated substrate and connected to the ground terminal, a ground conductor on the insulated substrate, an annular dielectric body placed on the ground conductor, a second electrode fabricated on an opposite surface of the insulated substrate in confronting relation to the ground conductor across the dielectric body and connected to the first electrode through a through hole defined in the insulated substrate, the ground terminal of the active component connected to ground high-frequency signal components through the first electrode, the through hole, the electrode, the dielectric body, and the ground conductor.

1 Claim, 6 Drawing Figures

HIGH-FREQUENCY CIRCUIT DEVICE WITH AN ANNULAR CAPACITOR ON THE BACK OF AN INSULATED SUBSTRATE

BACKGROUND OF THE INVENTION

The present invention relates to a high-frequency circuit device, and more particularly to a high-frequency circuit device composed of hybrid ICs including active components such as transistors having ground terminals grounded effectively in terms of high frequencies and characterized by an increased degree of integration.

Conventional high-frequency circuit devices include hybrid ICs such as transistors having emitters connected to bypass capacitors grounded to a ground conductor. It would be preferable to increase the areas of the parts constituting the bypass capacitor for effectively grounding high-frequency signal components. However, such increased areas of the capacitor parts would lead to a poorer degree of component integration.

SUMMARY OF THE INVENTION

It is an object of the present invention to provide a a high-frequency circuit device composed of hybrid ICs including active components such as transistors having ground terminals connected to bypass capacitors mounted on the back of an insulated substrate, thereby providing an effective capability to ground high-frequency signal components and an improved degree of integration.

According to the present invention, there is provided a high-frequency circuit device composed of hybrid ICs, comprising an insulated substrate, an active component fabricated on the insulated substrate and including a ground terminal for grounding high-frequency signal components, a first electrode fabricated on one surface of the insulated substrate and connected to the ground terminal, a ground conductor on the insulated substrate, a dielectric body placed on the ground conductor, a second electrode fabricated on an opposite surface of the insulated substrate in confronting relation to the ground conductor across the dielectric body and connected to the first electrode through a through hole defined in the insulated substrate, the ground terminal of the active component connected to ground high-frequency signal components through the first electrode, the through hole, the electrode, the dielectric body, and the ground conductor.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
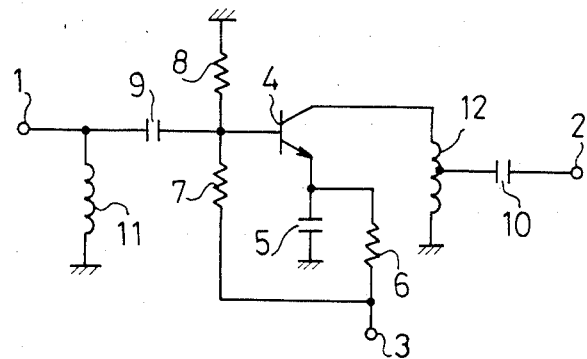
FIG. 1 is a circuit diagram of a high-frequency circuit.

There are known hybrid ICs fabricated on a ceramics substrate using printed thick-film circuit technology to form a high-frequency circuit as shown in FIG. 1. The high-frequency circuit of FIG. 1 includes a transistor 4 for amplifying a high-frequency signal applied to an input terminal 1. The transistor 4 has an emitter to which a DC power supply voltage from a power supply terminal 3 through a bias resistor 6. A bypass capacitor 5 is connected to the emitter of the transistor 4 for grounding high-frequency signal components. Designated at 2 is an output terminal, 7 and 8 resistors, 9 and 10 capacitors, and 11 and 12 coils.

Figure 2:
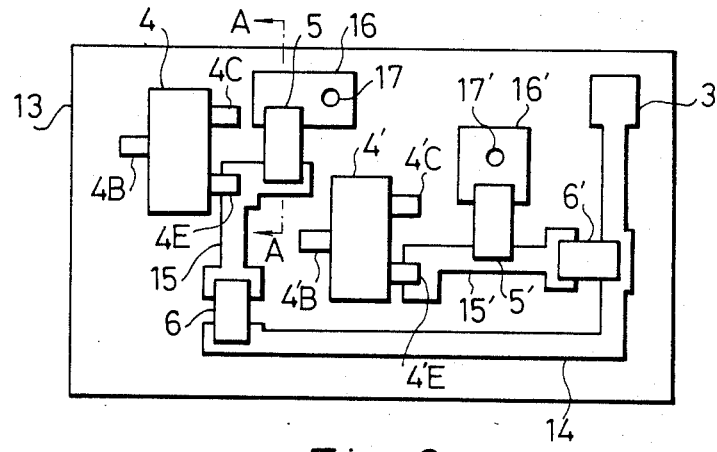
FIG. 2 is a plan view of a conventional high-frequency circuit device in which the high-frequency circuit shown in FIG. 1 is composed of hybrid ICs.

FIG. 2 shows a conventional high-frequency circuit device in which the circuit of FIG. 1 is composed of hybrid ICs. Those parts designated by the reference numerals 3 through 6 in FIG. 2 correspond to those bearing the same reference numerals in FIG. 1. Indicated at 4B, 4C, 4E are base, collector and emitter terminals, respectively, of the transistor 4, 13 a ceramics substrate, 14 and 15 lead electrodes, 16 an electrode having a portion constituting the bypass capacitor 5, and 7 a through hole connecting the electrode 16 to a ground conductor (not shown) mounted on the back of the ceramics substrate 13. Designated at 4', 6', 4'B, 4'C, 4'E, 15' and 17' are other components corresponding to the parts 4, 6, 4B, 4C, 4E, 15 and 17, respectively. As illustrated in FIG. 2, the emitter terminal 4E of the transistor 4 is connected via the lead electrode 15, the bypass capacitor 5, the electrode 16, and the through hole 17 to the ground conductor mounted on the back of the ceramics substrate 13.

Figure 3:
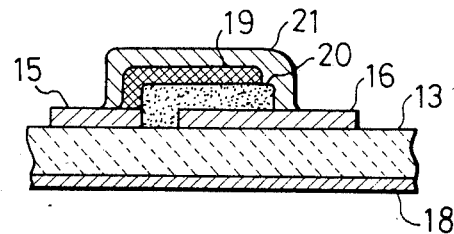
FIG. 3 is an enlarged cross-sectional view taken along line A—A of FIG. 2.

The bypass capacitor 5 as shown in FIG. 2 is fabricated by printed thick-film technology. The bypass capacitor 5 will be described in detail with reference to FIG. 3. Those parts bearing the reference numerals 13, 15, 16 in FIG. 3 are equivalent to those indicated by the same reference numerals in FIG. 2. Indicated at 18 is a ground conductor, 19 an upper electrode, 20 a dielectric body, and 21 a protective covering. In FIG. 3, the upper electrode 19 extends from the lead electrode 15 connected to the emitter terminal 4E of the transistor 4 and is positioned in confronting relation to the electrode 16 across the dielectric body 20. Thus, the bypass capacitor 5 is constituted of the upper electrode 19, the dielectric body 20 and the electrode 16. Although not shown in FIG. 3, the electrode 16 is connected to the ground conductor 18 by the through hole 17 (FIG. 2). The bypass capacitor 5' shown in FIG. 2 is also similarly constructed.

In the prior high-frequency circuit device illustrated in FIGS. 2 and 3, the bypass capacitors 5, 5' are fabricated on the ceramics substrate 13, and it is not preferred from the standpoint of increasing the degree of integration to increase the areas of the electrodes (19 and 16 as shown in FIG. 3) that constitute the bypass capacitors 5, 5'. Reduction of the areas of these electrodes however results in a failure in removing influences of residual inductances. This prevents effective grounding of high-frequency signal components. Conventional high-frequency circuit devices incorporating hybrid ICs have therefore suffered from contradictory problems; An attempt to provide better high-frequency grounding capability would fail to achieve improved integration, and greater integration would result in poorer high-frequency grounding ability.

The present invention will now be described with reference to FIGS. 4 through 6.

Figure 4:
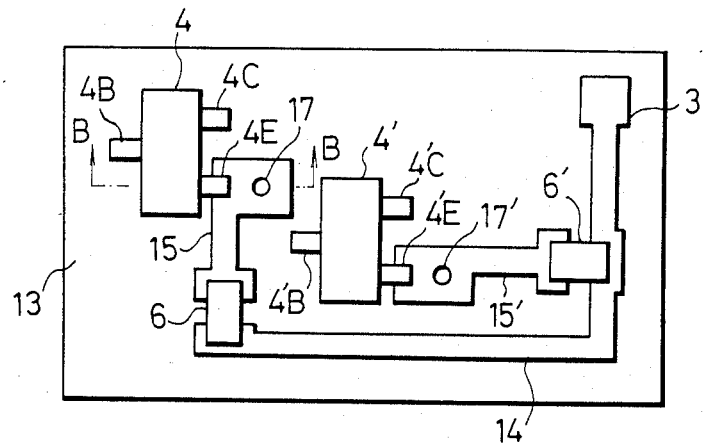
FIG. 4 is a plan view of a high-frequency circuit device according to an embodiment of the present invention.
Figure 5:
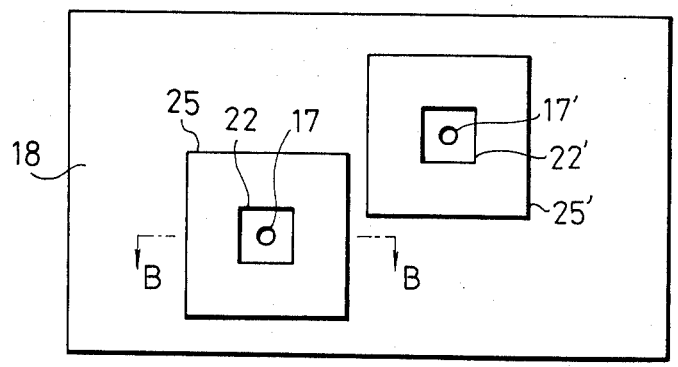
FIG. 5 is a bottom view of the high-frequency circuit device illustrated in FIG. 4.
Figure 6:
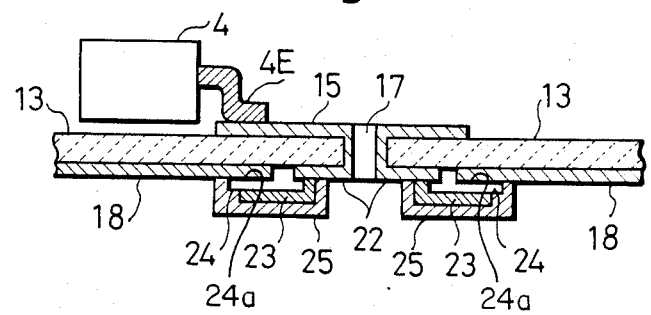
FIG. 6 is an enlarged cross-sectional view taken along line B—B of FIGS. 4 and 5.

Like or corresponding parts in FIGS. 4 through 6 are denoted by like or corresponding reference characters in FIGS. 1 through 3.

An electrode 22 fabricated on the back of a ceramics substrate 13 is connected to an emitter terminal 4E of a transistor 4 through a through hole 17 and a lead electrode 15. Designated at 23 is an upper electrode on the back of the substrate 13, 24 a dielectric body, and 25 a protectiving covering. The parts bearing the reference characters 17', 22', 25' in FIG. 5 are equivalent to those having the reference characters 17, 22, 25, respectively.

As shown in FIGS. 4 through 6, the high-frequency circuit device is composed of hybrid ICs arranged in the form of the high-frequency circuit as shown in FIG. 1. The emitter terminal 4E of the transistor 4 placed on the ceramics substrate 3 is connected through the lead electrode 15 and the through hole 17 to the back electrode 22 mounted on the back of the substrate 13 and insulated by the dielectric body 24 from the ground conductor 18. The annular dielectric body 24 has its peripheral surface 24a in contact with the ground conductor 18. The upper back electrode 23 extending from the back electrode 22 is disposed in confronting relation to the ground conductor 18 through the dielectric body 24. Thus, the bypass capacitor 5 as shown in FIG. 1 is constituted of an end of the back electrode 22, portions of the upper back electrode 23, the dielectric body 24 and the ground conductor 18.

With the arrangement of the invention, the bypass capacitor 5 is positioned on the back of the ceramics substrate 13 as a land on the ground conductor 13. Since there is no space needed for the capacitor 5 on the surface of the ceramics substrate 15, the overall degree of components integration can be increased. The capacitance of the bypass capacitor 5 is suitably selected so that it can cut off DC signal components while grounding high-frequency signal components.

While in the embodiment of FIGS. 4 and 6 the portions constituting the bypass capacitor 5 are square in shape, they may be circular in configuration by forming the upper back electrode 23 and the dielectric body 24 in an annular shape so that a space can be effectively utilized for the bypass capacitor 5.

The ground conductor 18 may be grounded by being placed on a metal chassis (not shown) in contact therewith. With the arrangement of the invention, the metal chassis is perforated to provide a hole having a shape corresponding to the bypass capacitor 5, or the protective covering 25 of FIG. 5.

Although a certain preferred embodiment has been shown and described, it should be understood that many changes and modifications may be made therein without departing from the scope of the appended claims.

What is claimed is:

1. In a high-frequency circuit device composed of hybrid ICs, including an insulated substrate, an active component fabricated on one side of said insulated substrate and including a ground terminal for grounding high-frequency signal components, a first electrode fabricated on said one side of said insulated substrate and connected to said ground terminal, a ground conductor on said insulated substrate, and a capacitor connected between said first electrode and said ground conductor, the improvement comprising said ground conductor being fabricated on the other side of said insulated substrate, said capacitor being formed by an annular dielectric body having a peripheral surface thereof in contact with said ground conductor, a hole formed through said insulated substrate positioned substantially in the center of said annular dielectric body, a second electrode fabricated on said other side of said insulated substrate in confronting relation to said ground conductor across said annular dielectric body and connected to said first electrode through said hole in said insulated substrate, whereby high-frequency signal components of said active component are grounded through said ground terminal connected to said first electrode and through said hole to said second electrode, said annular dielectric body, and said ground conductor.

* * * * *